United States Patent
Osawa et al.

(10) Patent No.: US 6,492,199 B2
(45) Date of Patent: Dec. 10, 2002

(54) METHOD OF MANUFACTURING A SEMICONDUCTOR PACKAGE WITH IMPROVED CROSS TALK AND GROUNDING

(75) Inventors: Kenji Osawa, Kanagawa (JP); Kazuhiro Sato, Kanagawa (JP); Makoto Ito, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/773,653

(22) Filed: Jan. 31, 2001

(65) Prior Publication Data

US 2001/0011767 A1 Aug. 9, 2001

Related U.S. Application Data

(62) Division of application No. 08/910,711, filed on Aug. 13, 1997, now Pat. No. 6,194,778.

(30) Foreign Application Priority Data

Aug. 16, 1996 (JP) .............................. 8-216227
Sep. 24, 1996 (JP) .............................. 8-251124

(51) Int. Cl.⁷ ............................................. H01L 21/48
(52) U.S. Cl. ....................... 438/111; 438/112; 438/118; 438/122; 438/123; 438/124; 438/127
(58) Field of Search ................................. 438/106, 108, 438/111, 112, 123, 124, 126, 127, 118, 121, 122, 977; 257/666, 667, 668, 669, 673, 674, 675, 688, 691, 693, 704, 710, 738, 780

(56) References Cited

U.S. PATENT DOCUMENTS

| | | | | |
|---|---|---|---|---|
| 5,756,377 A | * | 5/1998 | Ohsawa | 438/111 |
| 5,786,239 A | * | 7/1998 | Ohsawa et al. | 438/123 |
| 5,843,810 A | * | 12/1998 | Sato et al. | 438/123 |
| 5,886,399 A | * | 3/1999 | Ohsawa et al. | 257/668 |
| 5,901,436 A | * | 5/1999 | Ohsawa et al. | 29/827 |
| 5,982,033 A | * | 11/1999 | Ohsawa et al. | 257/737 |
| 6,020,626 A | * | 2/2000 | Ohsawa et al. | 257/668 |
| 6,051,450 A | * | 4/2000 | Ohsawa et al. | 438/123 |
| 6,054,773 A | * | 4/2000 | Ohsawa et al. | 257/783 |
| 6,074,898 A | * | 6/2000 | Ohsawa et al. | 438/123 |
| 6,078,097 A | * | 6/2000 | Ohsawa | 257/666 |
| 6,104,091 A | * | 8/2000 | Ito et al. | 257/738 |
| 6,114,755 A | * | 9/2000 | Ito et al. | 257/675 |
| 6,194,778 B1 | * | 2/2001 | Ohsawa et al. | 257/668 |

* cited by examiner

Primary Examiner—David L. Talbott
Assistant Examiner—Alonzo Chambliss
(74) Attorney, Agent, or Firm—Sonnenschein, Nath & Rosenthal

(57) ABSTRACT

A method of manufacturing a semiconductor chip that has electrode pads on the chip front surface and disposed inside a conductive outer ring. A film circuit is disposed on the chip front surface side. External connection thermals are formed on the film circuit so as to project there from. First leads electrically connect part of the electrode pads to part of the external connection terminals. A second lead electrically connects a grounding or power supply electrode pad to the outer ring, and a third lead electrically connects a grounding or power supply external connection terminal to the outer ring.

4 Claims, 14 Drawing Sheets

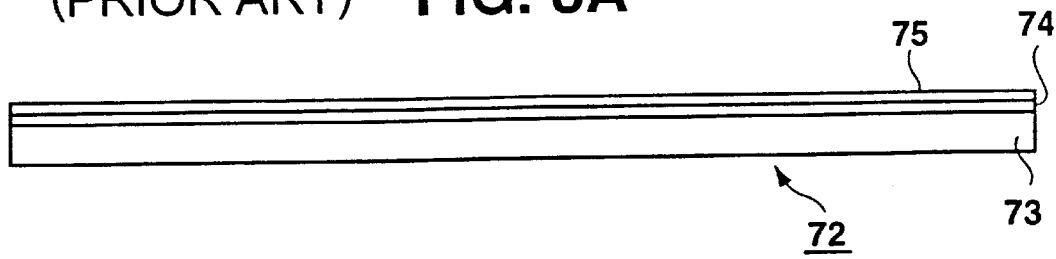
(PRIOR ART) FIG. 3A
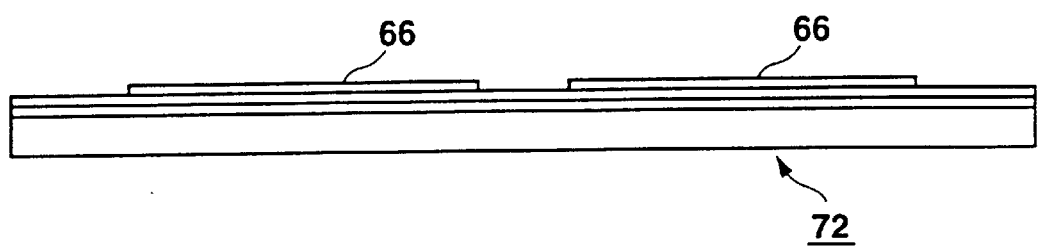
(PRIOR ART) FIG. 3B
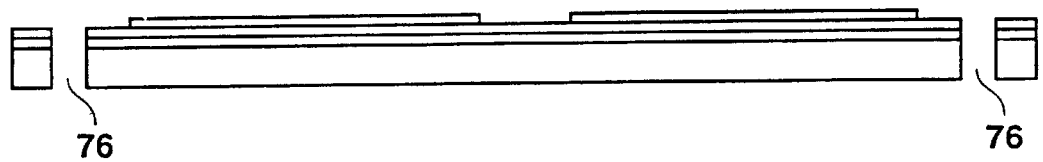
(PRIOR ART) FIG. 3C
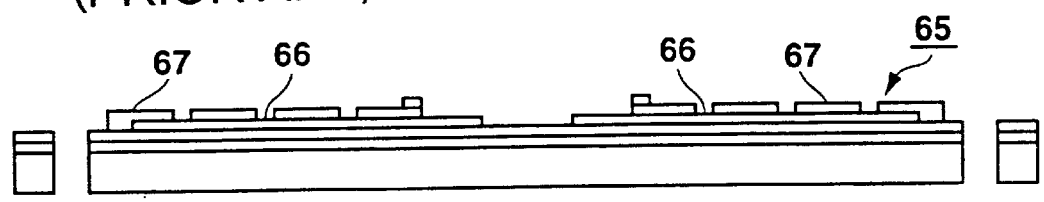
(PRIOR ART) FIG. 3D
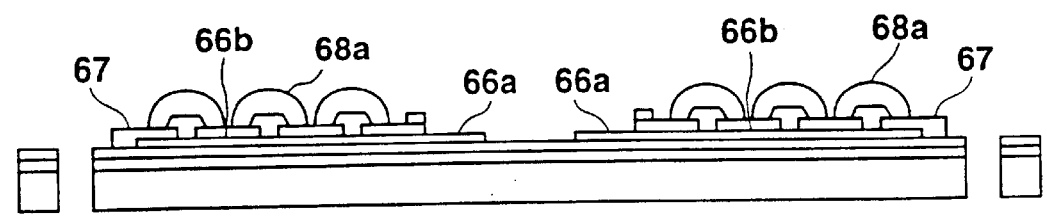
(PRIOR ART) FIG. 3E

(PRIOR ART) FIG. 5A
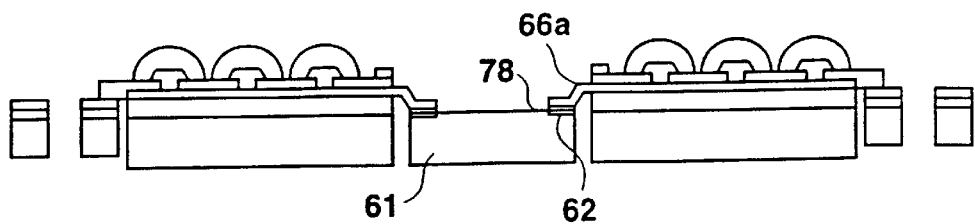
(PRIOR ART) FIG. 5B
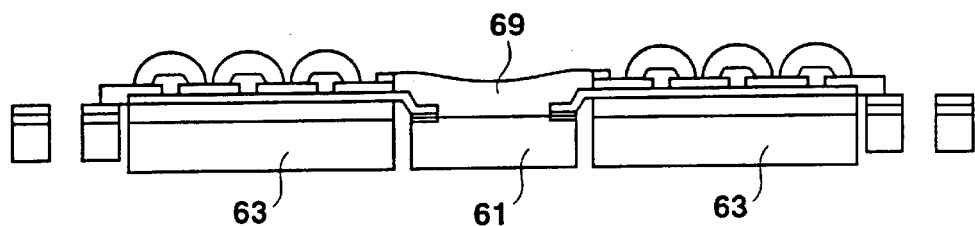
(PRIOR ART) FIG. 5C
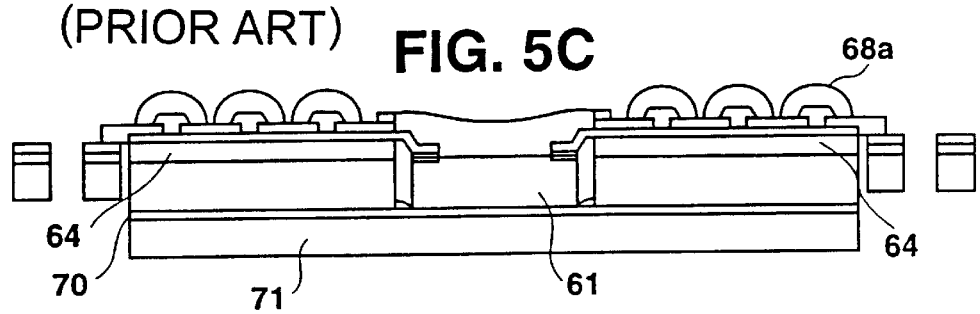
(PRIOR ART) FIG. 5D
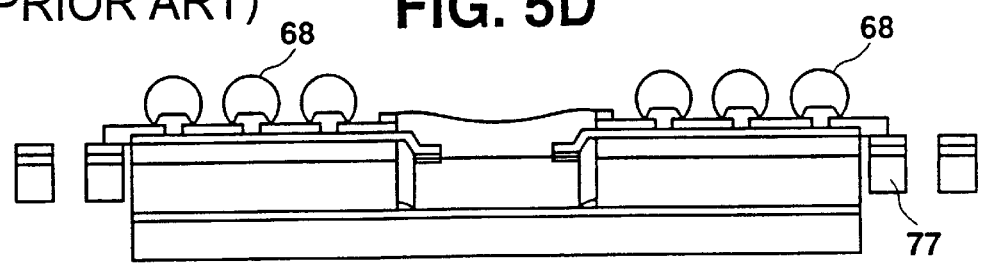
(PRIOR ART) FIG. 5E
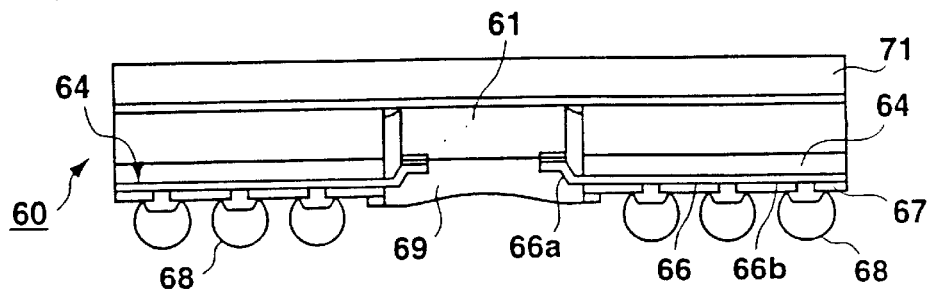

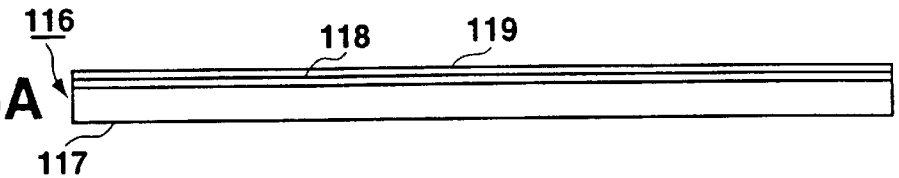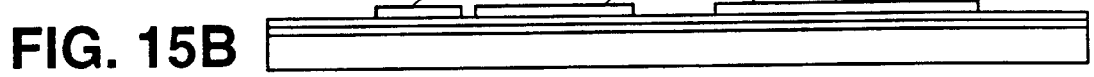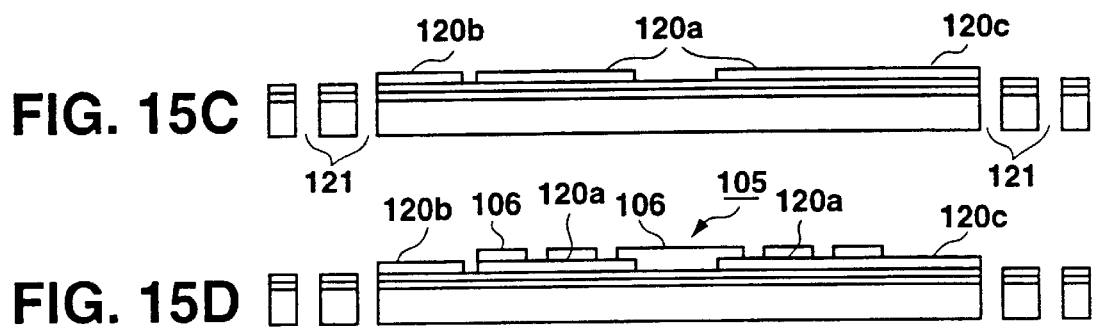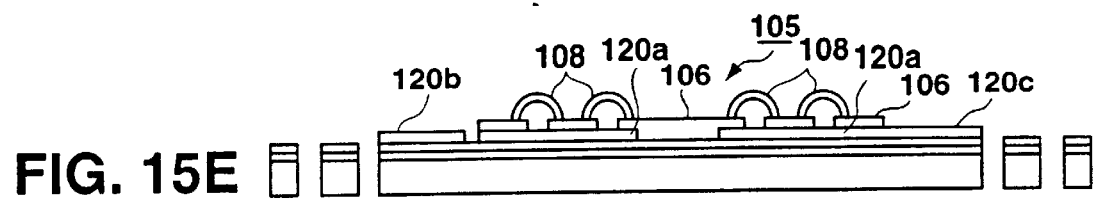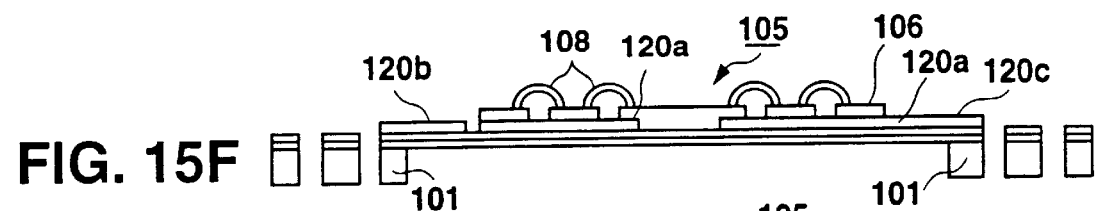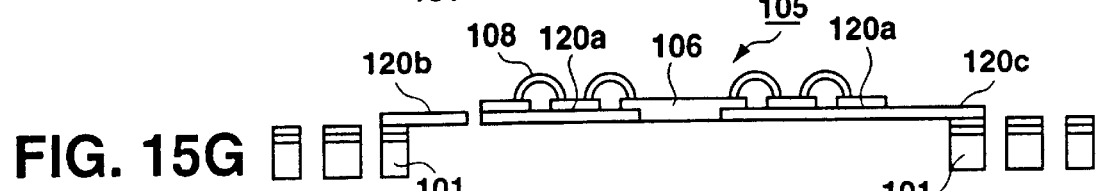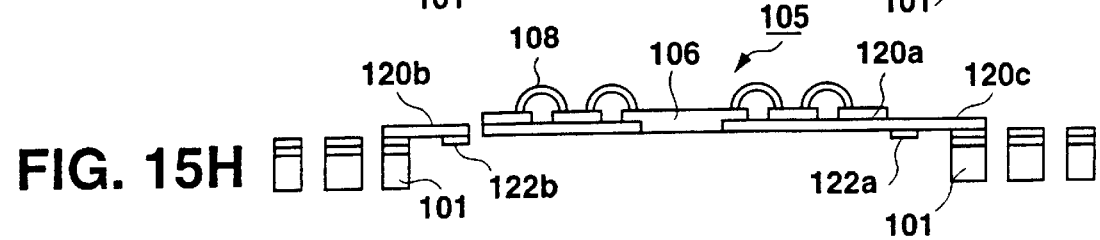

METHOD OF MANUFACTURING A SEMICONDUCTOR PACKAGE WITH IMPROVED CROSS TALK AND GROUNDING

RELATED APPLICATION DATA

This application is a divisional of application Ser. No. 08/910,711 filed Aug. 13, 1997, now U.S. Pat. No. 6,194,778. The present and foregoing applications claim priority to Japanese applications No. P08-216227 filed Aug. 16, 1996 and No. P08-251124 filed Sep. 24, 1996. All of the foregoing applications are incorporated herein by reference to the extent permitted by law.

BACKGROUND OF THE INVENTION

The present invention relates to a semiconductor package of a ultra-many-pin structure in which a semiconductor chip is bonded to a novel lead frame, and to a manufacturing method of the lead frame.

FIG. 1 shows a conventional semiconductor package which can be mounted on a printed wiring board or the like through an organic board having external connection terminals such as solder balls.

As shown in FIG. 1, a semiconductor chip 51 is mounted on the front surface of a multilayered organic wiring board 50 of about 2 to 6 layers which is made of an organic material. Electrode pads of the semiconductor chip 51 are connected to wiring films 52 that are formed on the front surface of the multilayered organic wiring board 50 by wire bonding, i.e., with gold wires 53 or the like.

The back surface of the multilayered organic wiring board 50 is provided with solder balls (external connection terminals) 55 which are electrically connected to the wiring films 52 on the front surface via through-holes 54. The solder balls 55 project from openings of a solder resist film 56. The semiconductor chip 51 is sealed with a sealing resin 57 together with the gold wires 53.

In the above-configured semiconductor package 58, the solder balls 55 formed on the back surface are connected to a printed wiring board 59. In many cases the multilayered organic wiring board 50 is called a ball grind array (BGA) because a number of solder balls 55 are arranged in grid form, and the semiconductor package 58 using the multilayered organic wiring board 50 is called a BGA package.

However, there is a certain limit in reducing the wiring pitch in the conventional semiconductor package 58, because the electrode pads of the semiconductor chip 51 are connected to the wiring films 52 of the multilayered organic wiring board 50 by wire bonding. In the case of a semiconductor package called TCP (tape carrier package), leads are formed by etching metal foil (copper foil) that is attached to an insulating film. Therefore, also in this case, due to restrictions such as one resulting from lead thinning by side etching, there is a certain limit in increasing the number of pins.

In view of the above, the present assignee has already proposed semiconductor packages of an ultra-many-pin structure in which a semiconductor chip is bonded to a novel lead frame (or lead frame structural body).

FIG. 2 is a side sectional view showing an example of such semiconductor packages of an ultra-many-pin structure.

In the illustrated configuration of a semiconductor package 60, a plurality of electrode pads 62 are formed on the front surface (chip bottom surface as viewed in FIG. 2) of a semiconductor chip 61 along its periphery. A reinforcement plate 63 is provided outside the semiconductor chip 61 so as to surround it, and the reinforcement plate 63 defines a package external shape. A wiring film 65 is laminated on the reinforcement plate 63 through an insulating bonding layer 64. The wiring film 65 is constituted of a plurality of leads 66 consisting of inner leads 66a and outer leads 66b and an insulating film 67 which covers and protects the outer leads 66b. The tips of the inner leads 66a are connected to the electrode pads 62 formed on the chip front surface, and solder balls (external connection terminals) 68 are formed on the outer leads 66b so as to penetrate through the insulating film 67. A peripheral space of the semiconductor chip 61 is charged with a sealing resin 69, and a radiation plate 71 is bonded to the chip back surface and the reinforcement plate 63 through a heat conductive adhesive 70.

Now, a manufacturing procedure of the above semiconductor package 60 will be described roughly.

First, to produce a lead frame, a metal base 72 of a three-layer structure is prepared as shown in FIG. 3A. The metal base 72 has a structure in which an aluminum film 74 is formed on the front surface of a substrate (hereinafter called a copper substrate) 73 made of copper or a copper alloy and a nickel film 75 is formed thereon. Then, as shown in FIG. 3B, a plurality of leads 66 are formed on the front surface of the metal base 72 by electrolytic copper plating. Then, as shown in FIG. 3C, slits 76 are formed to define a lead frame outer shape for each chip. Then, as shown in FIG. 3D, an insulating film 67 is laid on the leads 66, to form a wiring film 65 constituted of the plurality of leads 66 and the insulating film 67. At this time, the lead portions projecting from the insulating film 67 become inner leads 66a and the lead portions covered with and protected by the insulating film 67 become outer leads 66b. Subsequently, as shown in FIG. 3E, an undercoat film of nickel, for instance, is formed on the outer leads 66b which are covered with the insulating film 67, and a solder material 68a is laid on the undercoat film by electrolytic plating. At this time point, the solder material 68a has mushroom shapes.

Thereafter, as shown in FIGS. 4A and 4B, the copper substrate 73, the aluminum film 74, and the nickel film 75 of the metal base 72 are sequentially removed by selective etching while an outer ring 77 is left, so that the respective leads 66 are separated from and made independent of each other. Then, as shown in FIG. 4C, a reinforcement plate 63 is bonded to the surfaces of the outer leads 66b which are covered with the insulating film 67 through an insulting bonding layer 64. Then, as shown in FIG. 4D, bumps 78 are formed on the tips of the respective inner leads 66a extending from the insulating film 67.

Thus, a lead frame 79 before attachment of a semiconductor chip is completed.

Thereafter, to attach a semiconductor chip to the above-produced lead frame 79, the tips of the inner leads 66a are connected to electrode pads 62 of a semiconductor chip 61 through the bumps 78 as shown in FIG. 5A. Subsequently, as shown in FIG. 5B, a sealing resin 69 is injected into a peripheral space of the semiconductor chip 61 and then cured. Then, as shown in FIG. 5C, a radiation plate 71 is bonded to the back surface of the semiconductor. chip 61 and the reinforcement plate 63 through a heat conductive adhesive 70. Then, as shown in FIG. 5D, the solder material 68a which was laid by electrolytic plating in the previous lead frame manufacturing process is shaped by causing it to reflow, to obtain desired solder balls 68. Finally, as shown in FIG. 5E, the outer ring 77 is separated with the outer circumference of the reinforcement plate 63 as the boundary, to complete the semiconductor package 60 shown in FIG. 2.

The semiconductor package 60 realizes an ultra-many-pin structure beyond the previous limit, because the leads 66 can be patterned more finely, which results from the fact that the leads 66 are formed on the metal base 72 by electrolytic copper plating at the stage of manufacturing the lead frame 79. Further, the semiconductor package 60 is superior in heat dissipation because the radiation plate 71 is bonded to the chip back surface side.

However, even the above ultra-many-pin structure semiconductor package 60 has the following problems:

(1) Stress-induced breakage likely occurs in the bonding portion between the chip front surface and the sealing resin 69.

(2) The front surface of the semiconductor chip 61 is likely affected by radiations such as α-rays. As a countermeasure, it is necessary to coat polyimide or the like on the chip front surface.

(3) It takes time to charge the peripheral space of the semiconductor chip 61 with the sealing resin 69.

(4) Crosstalk noise likely occurs when the pattern of the leads 66 is made finer.

(5) The bumps 78 are polluted with a gas generated from the insulating bonding layer 64 when the bumps 78 are formed on the tips of the inner leads 66a in the lead frame manufacturing process.

(6) Since the solder balls 68 are obtained by shaping the mushroom-shaped solder members 68a, which are laid by electrolytic plating in the lead frame manufacturing process, into a ball shape by the reflow method immediately before the package is completed, the surfaces of the solder members 68a are oxidized during a period of time that elapses between the above two time points. Therefore, brushing is needed to eliminate oxide films prior to the reflowing of the solder members 68a. There is a possibility that the brushing causes pieces of the solder members 68a to fall off or the wiring film 65 to peel off the bonding layer 64.

FIG. 6 is a side sectional view showing another example of the semiconductor packages of an ultra-many-pin structure that have been proposed by the present assignee.

As shown in FIG. 6, a semiconductor chip 162 is disposed inside an outer ring 161. A plurality of electrode pads 163 are formed on the front surface of the semiconductor chip 162 along its periphery. A film circuit 165 is placed on and fixed to, via a bonding layer 164, a central portion of the chip front surface which excludes the pad forming region. The film circuit 165 consists of an insulating film 166 as a base and lead patterns 167 that are formed within the insulating film 166. Further, external connection terminals (solder balls) 168 are provided on the film circuit 165 at positions corresponding to the ends of the respective lead patterns 167. Leads 169 extending from the lead patterns 167 come out of the film circuit 165, and lead tips 169a are connected to the electrode pads 163 on the chip surface. A sealing resin 170 fills in the space between the outer ring 161 and the structure made up of the semiconductor chip 162, the bonding layer 164, and the film circuit 165.

In the semiconductor package having the above configuration, the lead patterns 167 including the leads 169 of the film circuit 165 are formed by electrolytic plating that uses a metal base (not shown), and the external connection terminals 169 are formed on the lead patterns 167 also by electrolytic plating. Thus, this semiconductor package realizes a many-pin structure in which the number of pins is beyond the limit so far existed. Further, part of the metal base is left as the outer ring 161, which constitutes the package outer frame. Therefore, the positional accuracy between the package outer frame and the external connection terminals 168 is assured, which enables easy execution of an alignment operation during package mounting. In addition, what is called a CSP (chip size package) structure is attained in which the package size is made at the same level as the chip size.

In the semiconductor package shown in FIG. 6, a ground (GND) line or a power line of a printed wiring board for package mounting (hereinafter referred to as a package mounting board) is connected to an electrode pad 163 of the semiconductor chip 162 via a given external connection terminal 168 and a corresponding lead pattern 167. However, for a certain signal to be processed, there may occur a case that the power line potential or the ground potential becomes unstable. It is desired that the semiconductor package be improved in this respect.

SUMMARY OF THE INVENTION

The present invention has been made to solve the above problems, and a first object of the invention is to provide a semiconductor package which can avoid stress-induced breakage in the bonding portion on the chip front surface, can suppress the influence of radiations, and enables high-speed sealing.

A second object of the invention is to provide a semiconductor package which can reduce crosstalk noise.

A third object of the invention is to provide a manufacturing method of a lead frame which allows formation of high-quality bumps on the tips of inner leads.

A fourth object of the invention is to provide a manufacturing method of a lead frame which makes it unnecessary to perform brushing in causing a reflow of a solder material that has been laid on leads by electrolytic plating.

A fifth object of the invention is to provide a semiconductor package of an ultra-many-pin structure which enables a ground line or a power line to be connected from a package mounting board to an electrode pad of a semiconductor chip in a stable manner.

According to the invention, there is provided a semiconductor package comprising a semiconductor chip having a plurality of electrode pads formed on a peripheral portion of a front surface of the semiconductor chip and an effective device region occupying an inside of the peripheral portion; an insulating, thick-film protective layer laminated on the effective device region of the semiconductor chip; a plurality of leads constituted of outer leads and inner leads being integral with and extending from the outer leads, the inner leads having tips being connected to the electrode pads of the semiconductor chip; an insulating film for protecting the outer leads; external connection terminals formed on the outer leads; a reinforcement plate provided so as to surround the semiconductor chip; and a sealing resin for filling in a peripheral space of the semiconductor chip.

In the semiconductor package having the above configuration, since the thick-film protective layer is laminated on the effective device region of the semiconductor chip, the influence of radiations can be suppressed by the shielding effect of the thick-film protective layer even without subjecting the chip front surface to any coating treatment. Further, since the interposition of the thick-film protective layer reduces the space to be charged with the sealing resin, the resin sealing time can be shortened as much. Further, since the front surface of the semiconductor chip is covered with the thick-film protective layer rather than a sealing resin, stress-induced breakage can be prevented from occurring in the bonding portion on the chip front surface.

Further, according to the invention, there is provided a semiconductor package comprising a semiconductor chip having a plurality of electrode pads formed on a peripheral portion of a front surface of the semiconductor chip; a plurality of leads constituted of outer leads and inner leads being integral with and extending from the outer leads, the inner leads having tips being connected to the electrode pads of the semiconductor chip; an insulating film for protecting surfaces on one side of the outer leads; external connection terminals formed on the outer leads; a conductive reinforcement plate provided so as to surround the semiconductor chip, and bonded to surfaces on the other side of the outer leads through an insulating adhesive layer; a conductive outer ring provided so as to surround the reinforcement plate, and electrically connected to at least one of the outer leads; and a conductive paste for filling in a space between the reinforcement plate and the outer ring.

In the semiconductor package having the above configuration, by electrically connecting the outer ring to at least one of the outer leads, say, a grounding outer lead, the grounding outer lead and the reinforcement plate are electrically connected to each other via the outer ring. Thus, a microstrip structure is realized in which the insulating bonding layer (dielectric) is interposed between the plurality of leads (strip conductors) and the reinforcement plate (grounding plane), whereby crosstalk noise can be reduced.

Further, according to the invention, there is provided a manufacturing method of a lead frame, comprising the steps of forming a plurality of leads on a surface of a metal base of a laminated structure by metal plating; separating the plurality of leads from each other by selectively removing the metal base by etching; and forming bumps on tips of the respective separated leads, and then bonding a reinforcement plate to lead surfaces excluding bump forming regions thereof.

In the above lead frame manufacturing method, since the bumps are formed before the reinforcement plate is bonded to the lead surfaces, the bumps are never polluted by a gas generated from a bonding layer for bonding of the reinforcement plate.

Further, according to the invention, there is provided a manufacturing method of a lead frame, comprising the steps of forming a plurality of leads on a surface of a metal base of a laminated structure by metal plating; covering given regions of the leads with an insulating film; and laying a solder material on the leads at given positions by electrolytic plating with the insulating film used as a mask, and, immediately thereafter, shaping the solder material into ball shapes by reflowing.

In the above lead frame manufacturing method, since the solder material is shaped into balls by reflowing immediately after it is laid on the leads at the given positions by electrolytic plating, there occurs almost no oxidation of the solder material over time. Therefore, it is not necessary to perform brushing prior to the reflowing.

According to another aspect of the invention, there is provided a semiconductor package comprising a conductive outer ring; a semiconductor chip having a plurality of electrode pads on a peripheral portion of a front surface of the semiconductor chip and disposed inside the conductive outer ring; a film circuit disposed and formed on the side of the front surface of the semiconductor chip; a plurality of external connection terminals formed on the film circuit so as to project therefrom; first leads for electrically connecting part of the electrode pads formed on the semiconductor chip to part of the external connection terminals formed on the film circuit; a second lead for electrically connecting a grounding or power supply electrode pad among the electrode pads formed on the semiconductor chip to the outer ring; a third lead for electrically connecting a grounding or power supply external connection terminal among the external connection terminals formed on the film circuit to the outer ring; and a conductive stage bonded to a back surface of the semiconductor chip and the outer ring through respective conductive bonding layers.

In the semiconductor package having the above configuration, the grounding or power supply electrode pad is short-circuited with the chip back surface via the second lead, the outer ring, and the conductive stage, and the grounding or power supply external connection terminal is short-circuited with the chip back surface via the third lead, the outer ring, and the conductive stage. As a result, the chip back surface serves as the common ground or power supply, and the outer ring and the conductive stage that are connected to the chip back surface have the same potential. Therefore, a grounding line or a power line from a package mounting board can be connected to the electrode pad of the semiconductor chip in a more stable manner.

BRIEF DESCRIPTION OF THE DRAWINGS

FIGS. 3A–3E and FIGS. 4A–4D show a manufacturing process of a lead frame used in the semiconductor package of FIG. 2;

FIGS. 5A–5E show a manufacturing process of the semiconductor package of FIG. 2;

FIG. 15A–15H show a manufacturing process of a lead frame used in the semiconductor package of FIG. 13;

DESCRIPTION OF THE PREFERRED EMBODIMENTS

Embodiments of the present invention will be hereinafter described in detail with reference to the accompanying drawings.

Figure 7:
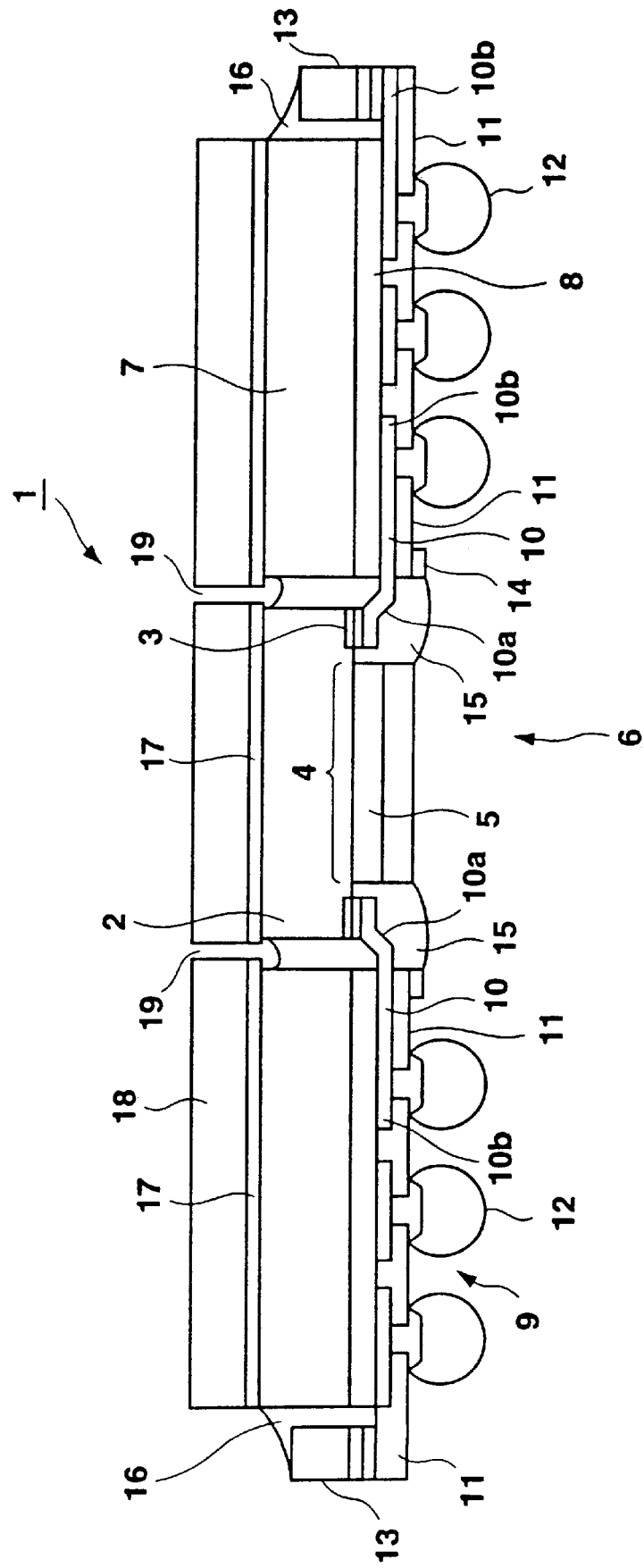
FIG. 7 is a side sectional view of a semiconductor package according to an embodiment of the invention.

FIG. 7 is a side sectional view of a semiconductor package according to an embodiment of the invention.

In the illustrated configuration of a semiconductor package 1, a plurality of electrode pads 3 are formed on the front surface (chip bottom surface as viewed in FIG. 7) of a semiconductor chip 2 along its periphery, and the inside of the pad forming region is made an effective device region 4. An insulating, thick-film protective layer 6 having a bonding layer 5 as a base is laminated on the effective device region 4 of the semiconductor chip 2.

On the other hand, a reinforcement plate 7 is provided outside the semiconductor chip 4 so as to surround it. A wiring film 9 is laminated on the reinforcement plate 7 through an insulating bonding layer 8. The wiring film 9 is constituted of a plurality of leads 10 consisting of inner leads 10a and outer leads 10b and an insulating film 11 which covers and protects the outer leads 10 b. The inner leads 10a are integral with and extend from the outer leads 10b. The tips of the inner leads 10a are connected to the electrode pads 3 of the semiconductor chip 2. On the other hand, external connection terminals 12 are formed on the outer leads 10b so as to penetrate through the insulating film 11.

Figure 1:
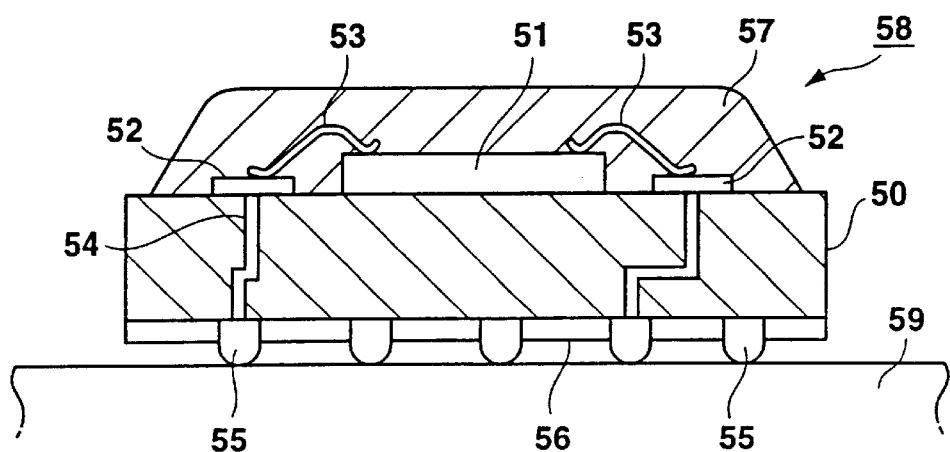
FIG. 1 is a side sectional view showing a conventional BGA package.
Figure 2:
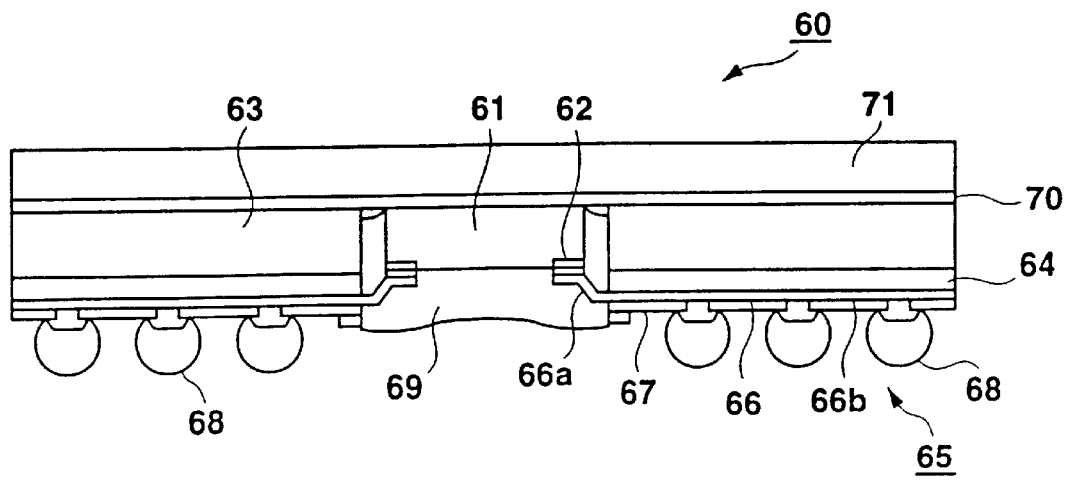
FIG. 2 is a side sectional view showing an example of a semiconductor package of an ultra-many pin structure.
Figure 4A:
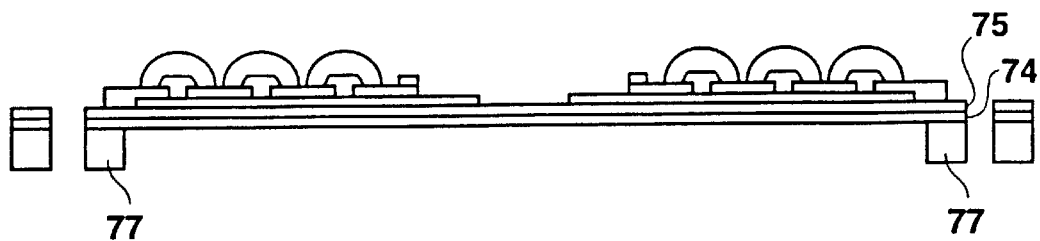
Figure 4B:
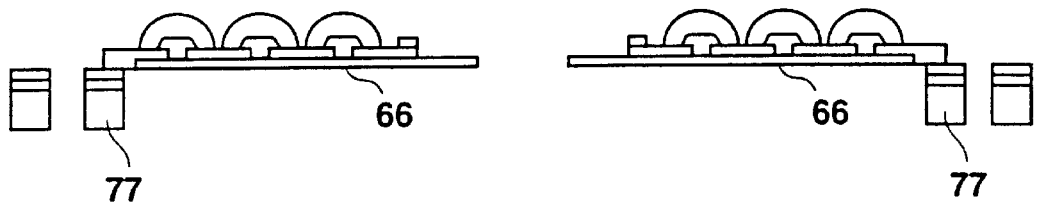
Figure 4C:
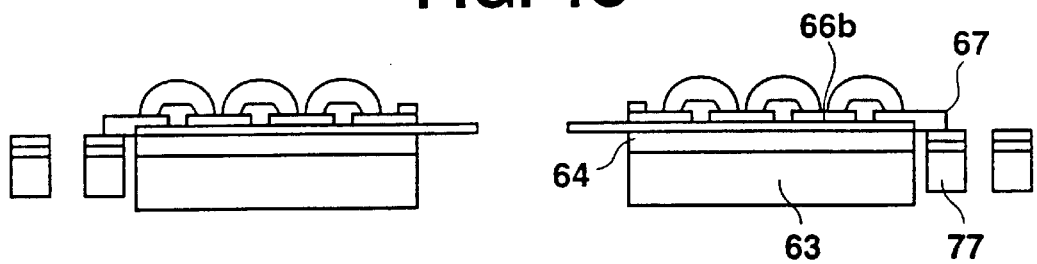
Figure 4D:
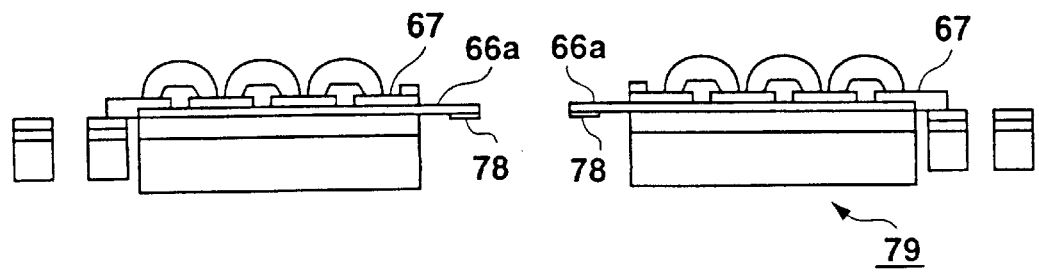
Figure 6:
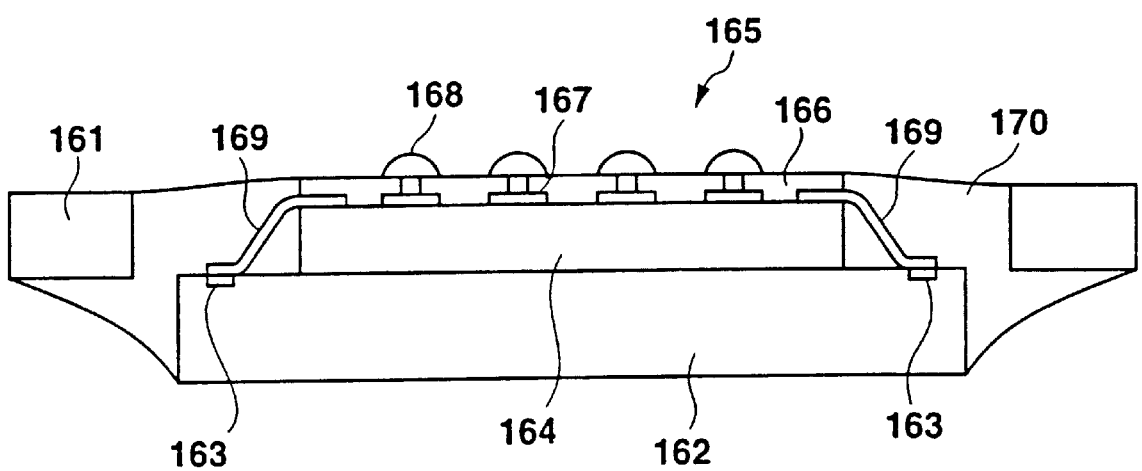
FIG. 6 is a side sectional view showing another example of a semiconductor package of an ultra-many pin structure.

In addition, a conductive outer ring 13 is provided outside the reinforcement plate 7 so as to surround it. At least one of the outer leads 10b extends onto the outer ring 13 and the extended portion is electrically connected the latter. A sealing resin 15 fills in a peripheral space of the semiconductor chip 2 with the thick-film protective layer 6 and a reinforcement tape 14 on the insulating film 11 serving as dams. A space between the reinforcement plate 7 and the outer ring 13 is charged with a conductor paste 16. A radiation plate 18 is bonded to the back surface (chip top surface as viewed in FIG. 1) of the semiconductor chip 2 and the reinforcement plate 7 through a heat conductive adhesive 17. Degassing holes 19 communicating with the space charged with the sealing resin 15 penetrate through the radiation plate 18 in its central portion.

Next, a description will be made of a manufacturing procedure until completion of the semiconductor package 1 including a manufacturing method of a lead frame according to the invention.

Figure 8A:
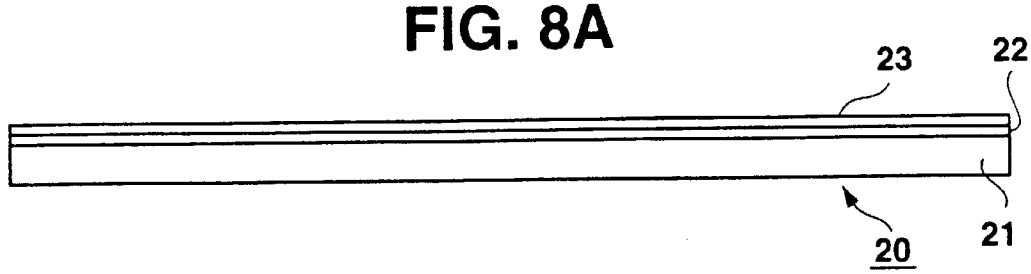
FIGS. 8A–8E and 9A–9D show a manufacturing process of a lead frame used in the semiconductor package of FIG. 7.

First, as for manufacture of a lead frame, a metal base 20 which is a laminate plate of a three-layer structure is prepared as shown in FIG. 8A. The metal base 20 has a structure obtained by forming an aluminum film 22 having a thickness of about 3 μm on the front surface of a substrate (hereinafter called a copper substrate) 21 having a thickness of about 150 μm and made of copper of a copper alloy by evaporation, for instance, and forming thereon a nickel film 23 having a thickness of about 2 μm.

Among the above layers, the copper substrate 21 itself will not constitute any leads and will finally be removed except an outer ring portion (described later). However, the copper substrate 21 is indispensable for formation of a very fine lead pattern. The aluminum film 22 corresponds to an etching stopper film to prevent the front side of the metal base 20 from being etched when the copper substrate 21 will be etched in a later step. On the other hand, the nickel film 23 corresponds to a plating undercoat film, i.e., an undercoat film for electrolytic plating for forming leads on the front surface of the metal base 20.

As for the metal base 20, for instance, a chromium film of about 0.5 μm in thickness may be formed as a close contact film between the aluminum film 22 and the nickel film 23 to improve the adhesiveness of these films. As for the etching stopper film, a nickel film may be formed instead of the aluminum film 22. As for the plating undercoat film, a copper thin film may be formed instead of the nickel film 23.

Figure 8B:
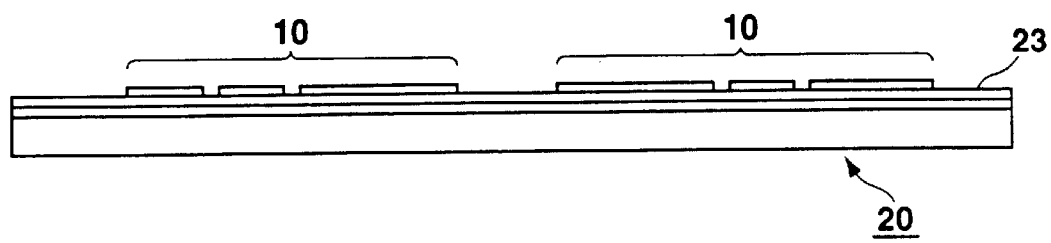

Then, as shown in FIG. 8B, a plurality of leads 10 (for instance, copper leads of about 30 μm in thickness) are formed on the front surface of the metal base 20, i.e., on the front surface of the nickel film 23, by selective plating. At this time, at least one of the leads 10 is so formed as to extend to an outer ring portion (described later). The selective plating is performed such that after the front surface of the metal base 20 is selectively covered with a resist pattern, electrolytic copper plating is performed with the resist pattern used as a mask. As a result, the leads 10 are obtained which have superior film quality and a fine pattern.

Figure 8C:
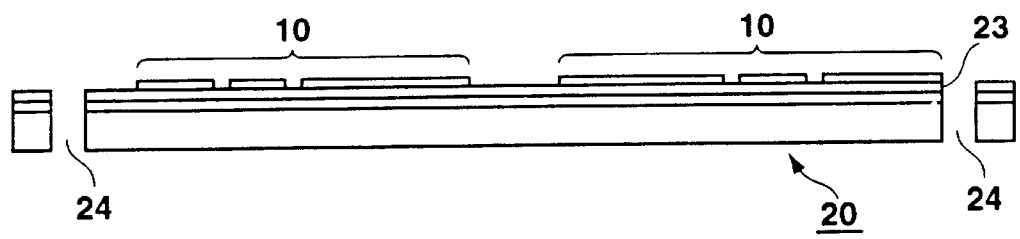

Then, as shown in FIG. 8C, slits 24 for defining a lead frame outer shape for each chip and holes (not shown) for facilitating the manufacture are formed by performing selective etching on the metal base 20 from both front and back sides.

Figure 8D:
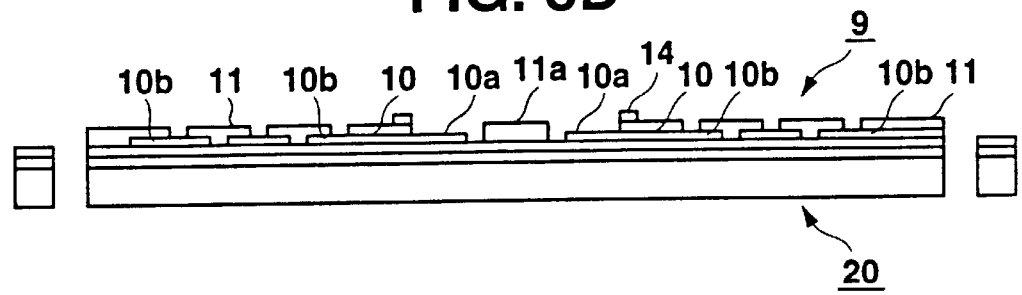

Then, as shown in FIG. 8D, an insulating film 11 (for instance, a polyimide film of about 25 μm in thickness) is laid on portions to become outer leads 10b of the plurality of leads 10 formed by selective plating, and a ring-like reinforcement tape 14 is bonded to the insulating film 11. The lead portions projecting from the insulating film 11 (i.e., reinforcement tape 14) correspond to inner leads 10a. A part 11a of the above-mentioned thick-film protective layer 6 is formed so as to be integral with the insulating film 11 in a region (chip bonding region) through which the inner leads are opposed to each other.

At this stage, a wiring film 9 consisting of the plurality of leads 10 and the insulating film 11 is constructed on the metal base 20.

Figure 8E:
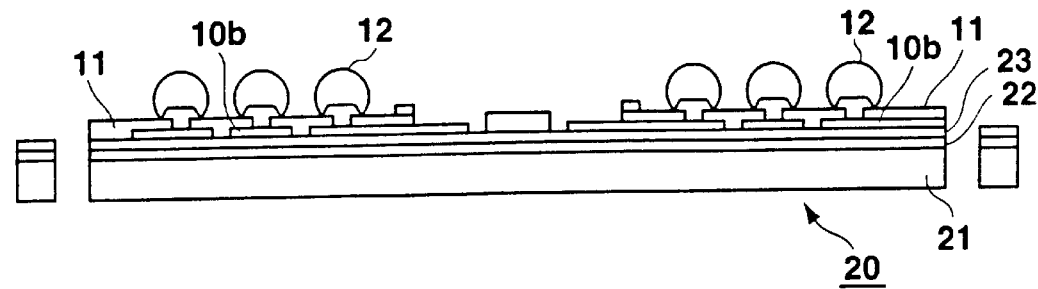

Then, as shown in FIG. 8E, external connection terminals 12 (for instance, solder balls) are formed on the outer leads 10b which are covered with and protected by the insulating film 11 by using the insulating film 11 as a mask. The external connection terminals 12 are obtained by forming a nickel undercoat film of about 110 μm in thickness on portions of the outer leads 10b exposed through the insulating film 11 by electrolytic plating, for instance, then laying a solder material (a tin-lead alloy) of about 230 μm in thickness on the undercoat film by electrolytic plating, and finally shaping the solder material into balls by causing it to reflow.

Figure 9A:
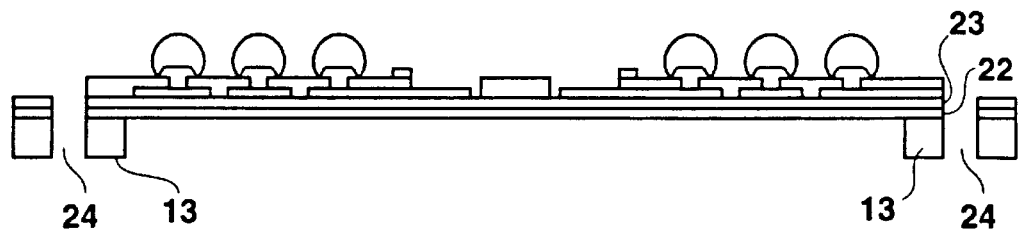

Subsequently, as shown in FIG. 9A, the copper substrate 21 of the metal base 20 is removed by selective etching such that an outer ring 13 is left inside the slits 24. In this etching, only the copper substrate 21 is removed since the aluminum film 22 acts as an etching stopper.

Figure 9B:
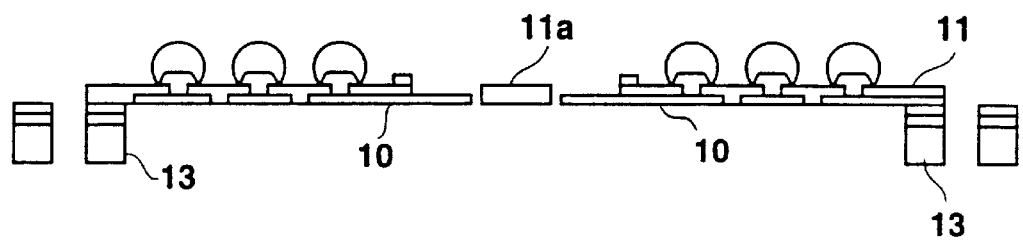

Then, as shown in FIG. 9B, the aluminum film 22 of the metal base 20 is removed by selective etching and also the nickel film 23 is removed by selective etching, so that the respective leads 10 are separated from and made independent of each other. Although FIG. 9B is drawn such that the insulating film 11 and the part 11a of the thick-film protective layer 6 are separated from each other, actually they are connected to each other by suspension portions (not shown) that are integral with the insulating film 11.

Figure 9C:
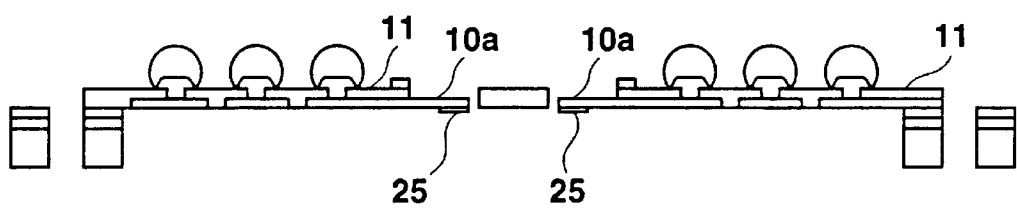

Then, as shown in FIG. 9C, aluminum bumps 25 are formed on the tips of the respective inner leads 10a extending from the insulating film 11 by sputtering or evaporation, for instance.

Figure 9D:
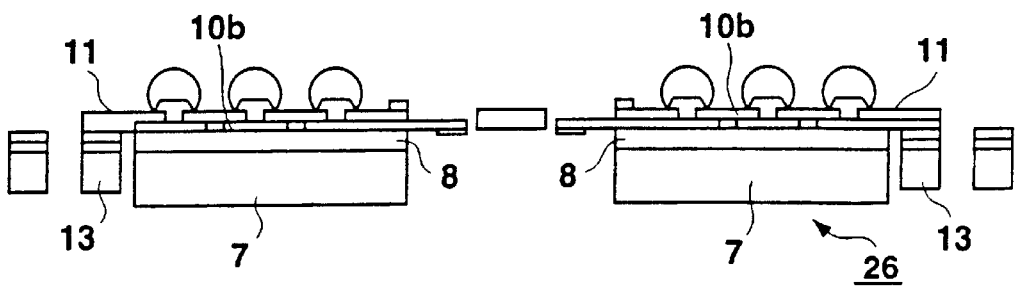

Then, as shown in FIG. 9D, a reinforcement plate 7 is bonded to the surface of the outer leads 10b which are protected by the insulating film 11 through an insulating bonding layer 8. In the bonding of the reinforcement plate 7, the inner circumference of the outer ring 13, which was formed above by selective etching, can be used as an alignment reference.

Thus, a lead frame 26 before attachment of a semiconductor chip is completed.

In the above lead frame manufacturing method, the reinforcement plate 7 is bonded through the insulating bonding layer 8 after the bumps 25 are formed on the tips of the inner leads 10a. Therefore, a problem can be avoided that the bumps 25 would otherwise be polluted by a gas generated from the insulating bonding layer 8 during bump formation (for instance, during aluminum evaporation).

Further, in the above lead frame manufacturing method, the solder material is shaped into the final form (balls) by reflowing immediately after the solder material is laid on the outer leads 10b by electrolytic plating. Since there occurs almost no deterioration (oxidation etc.) over time of the solder material, it is not necessary to perform brushing prior to the reflowing. As a result, failures that would otherwise be caused by brushing (falling off of a ball, peeling of the wiring film 9, etc.) can be avoided.

Figure 10A:
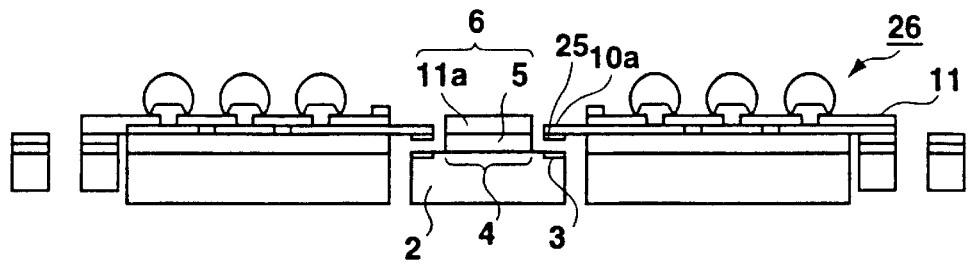
FIGS. 10A–10E show a manufacturing processing of the semiconductor package of FIG. 7.

Next, as for attachment of a semiconductor chip, as shown in FIG. 10A, a semiconductor chip 2 is bonded (die bonding) to the part 11a of the thick-film protective layer 6 provided in the chip bonding region through a bonding layer of, for instance, 50–150 µm in thickness while alignment between the semiconductor chip 2 and the lead frame 26 is made. In this state, the thick-film protective layer 6 having the bonding layer 5 as a base is laminated on an effective device region 4 of the semiconductor chip 2, and the tips (bumps 25) of the inner leads 10a are opposed to corresponding electrode pads 3 of the semiconductor chip 2.

Figure 10B:
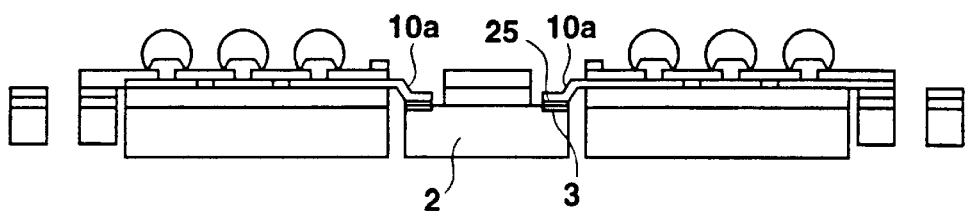

Then, as shown in FIG. 10b, the tips of the respective inner leads 10a are bonded to the electrode pads 3 of the semiconductor chip 2 through the bumps 25 by single point bonding.

Figure 10C:
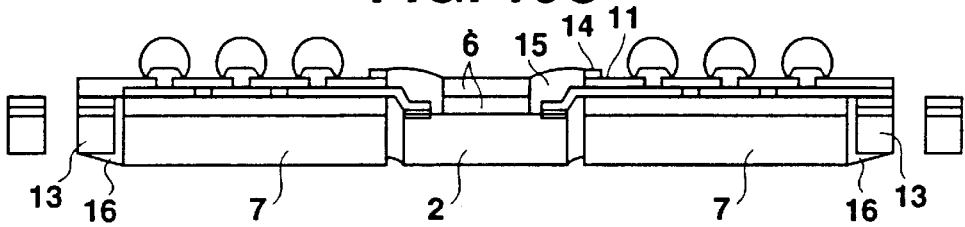

Then, as shown in FIG. 10C, a sealing resin 15 such as an epoxy resin or a silicone resin is injected into a peripheral space of the semiconductor chip 2 by potting and then cured, whereby the peripheral parts are integrated with each other. Further, the space between the reinforcement plate 7 and the outer ring 13 is charged with a conductor paste 16 such as a silver paste or a copper paste and the conductor paste 16 is then cured, whereby the reinforcement plate 7 and the outer ring 13 are integrated with each other. In the potting of the sealing resin 15, the thick-film protective layer 6 on the chip 2 and the reinforcement tape 14 on the insulating film 11 serve as dams for stopping the resin.

Figure 10D:
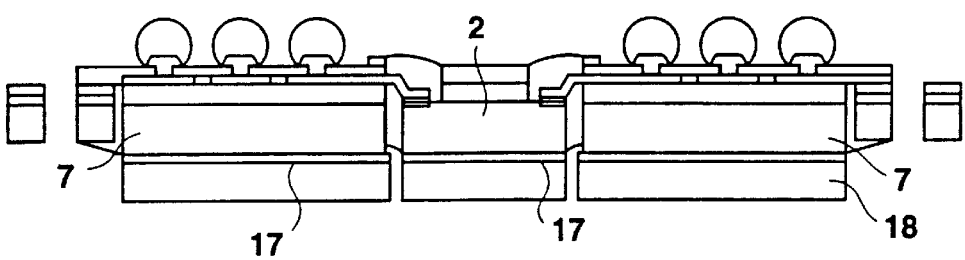

Then, as shown in FIG. 10D, a radiation plate 18 is bonded to the back surface of the semiconductor chip 2 and the reinforcement plate 7 through a heat conductive adhesive 17.

Figure 10E:
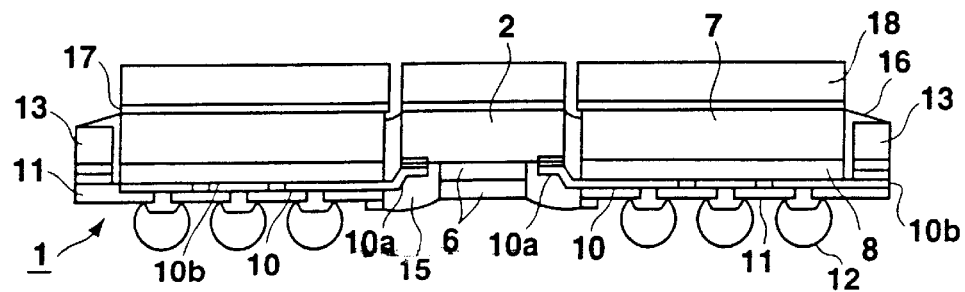

Finally, as shown in FIG. 10E, unnecessary portions are removed with the outer circumference of the outer ring 13 as the boundary. Thus, the semiconductor package 1 shown in FIG. 7 is completed.

In the semiconductor package 1 having the above configuration, since the thick-film protective layer 6 is laminated on the effective device region 4 of the semiconductor chip 2, the shielding effect of the thick-film protective layer 6 can suppress the influence of radiations such as α-rays even without coating the chip front surface with any film such as a polyimide film. Further, since the interposition of the thick-film protective layer 6 greatly reduces the space, to be charged with the sealing resin 15, the resin sealing time can be shortened as much. Further, since the front surface of the semiconductor chip 2 is covered with the thick-film protective layer 6 (in the conventional technique, with a sealing resin), breakage can be prevented from occurring in the bonding portion between the sealing resin 15 and the chip front surface due to thermal stress in the package 1.

In addition, by electrically connecting the conductive outer ring 13 to at least one of the outer leads 10b, say, an outer lead 10b for grounding, and charging the space between the outer ring 13 and the reinforcement plate 7 with the conductor paste 16, the grounding outer lead 10b is electrically connected to the reinforcement plate 7 via the outer ring 13. Thus, a microstrip structure is realized in which the insulating bonding layer 8 (dielectric) is interposed between the plurality of leads 10 (strip conductors) and the reinforcement plate 7 (grounding plane). As a result, crosstalk noise can be reduced as a measure for increasing the device operation speed.

Figure 11:
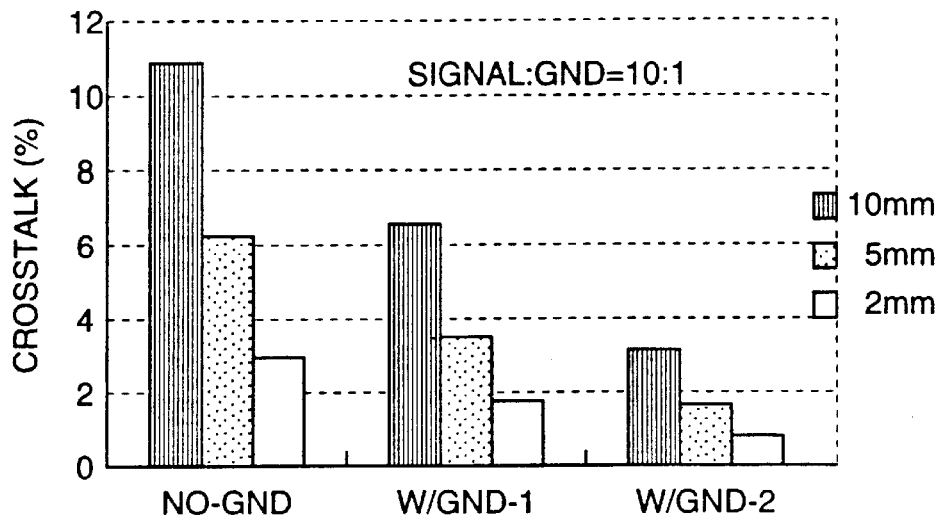
FIG. 11 is a graph comparing crosstalk noise characteristics.

Incidentally, FIG. 11 shows a result of an experiment in which a comparison of crosstalk noise was made between cases where the grounding (GND) outer lead 10b is electrically connected to the reinforcement plate 7 (W/GND-1 and W/GND-2) and a case where they are not electrically connected to each other (NO-GND) by using a signal of 200 MHz.

In FIG. 11, "W/GND-1" and "W/GND-2" represent cases where the thickness of the dielectric (insulating bonding layer 8) is 150 µm and 50 µm, respectively. Measurements were made for three patterns in which the length of the leads (signal transmission paths) is 10 mm, 5 mm, and 2 mm.

As seen from FIG. 11, compared to the case of "NO-GND," a crosstalk noise reduction effect of about 40% is obtained in the case of "W/GND-1" and that of about 70% is obtained in the case of "W/GND-2."

The above result also evidences that the crosstalk noise can greatly be reduced by realizing the above-described microstrip structure.

Further, the outer ring 13, whose relative position with respect to the external connection terminals 12 is assured, constitutes the package outer frame. Therefore, as for alignment with a package mounting printed circuit board or the like, a high-precision alignment can be established between the external connection terminals 12 of the package side and a land portion of the printed circuit board side merely by positioning the outer ring 13 through image recognition or the like.

Figure 12A:
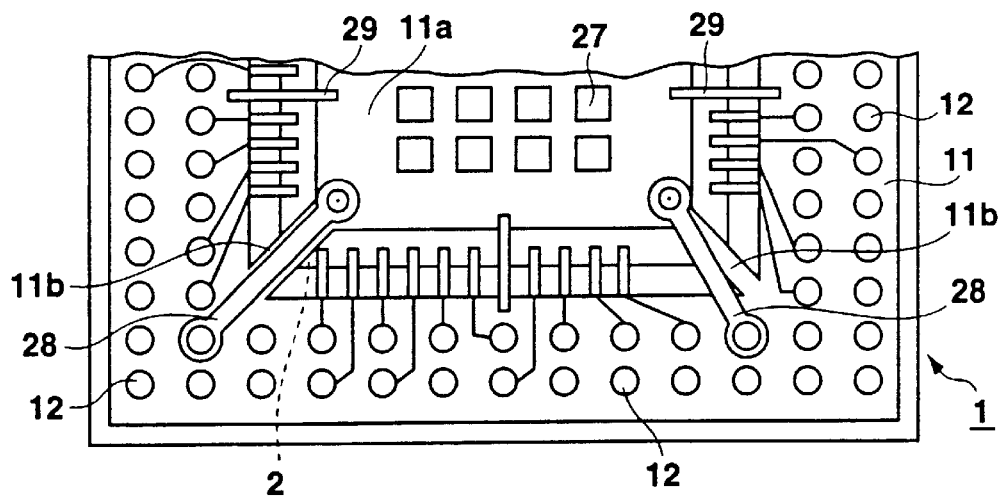
FIGS. 12A and 12B are a partial plan view and a side sectional view, respectively, showing an application example of the semiconductor package of the embodiment.
Figure 12B:
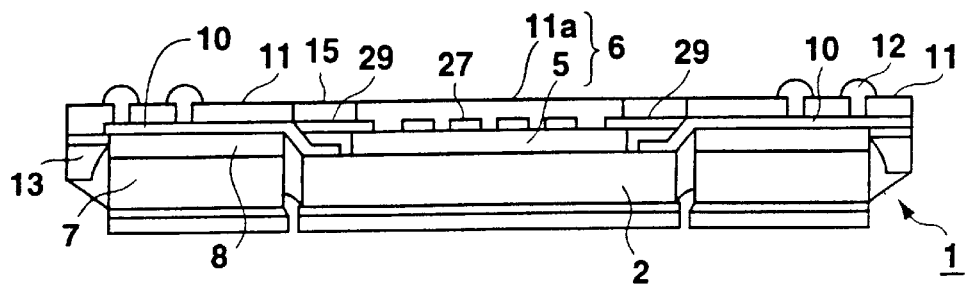

FIGS. 12A and 12B illustrate an application example of the semiconductor package of the embodiment. FIGS. 12A and 12B are a partial plan view and a side sectional view thereof.

The semiconductor package 1 shown in FIGS. 12A and 12B has a feature that dummy patterns 27 for reinforcement are embedded in the thick-film protective layer 6 which is laminated on the effective device region 4 of the semiconductor chip 2. The dummy patterns 27 can be embedded in the thick-film protective layer 6 by forming those by electrolytic plating at the same time as the plurality of leads 10 in manufacturing the lead frame, covering those with the portion 11a of the insulating film 11, and bonding the bonding layer 5 to the portion 11a in the chip attachment step. To link the insulating film 11 and the thick-film protective layer 6 to each other, suspension portions 11b which are integral with the insulating film 11 extend from the four corners of the thick-film protective layer 6. Suspension leads 28 for reinforcement also bridge the insulating film 11 and the thick-film protective layer 6 along the suspension portions 11b. Further, suspension leads 29 for reinforcement bridge the insulating film 11 and the respective sidelines of the thick-film protective layer 6. Like the dummy patterns 27, the suspension leads 28 and 29 can be formed by electrolytic plating at the same time as the leads 10 is formed.

In the semiconductor package 1 having the above configuration, since the dummy patterns 27 are embedded inside the thick-film protective layer 6, expansion/contraction of the thick-film protective layer 6 due to a temperature variation can be suppressed. Since this reduces thermal stress inside the package 1 during or after the package mounting, the reliability of the semiconductor package 1 can be increased. Further, the provision of the dummy patterns 27 makes it possible to prevent deformation of the thick-film protective layer 6 before attachment of the semiconductor chip 2.

Figure 13:
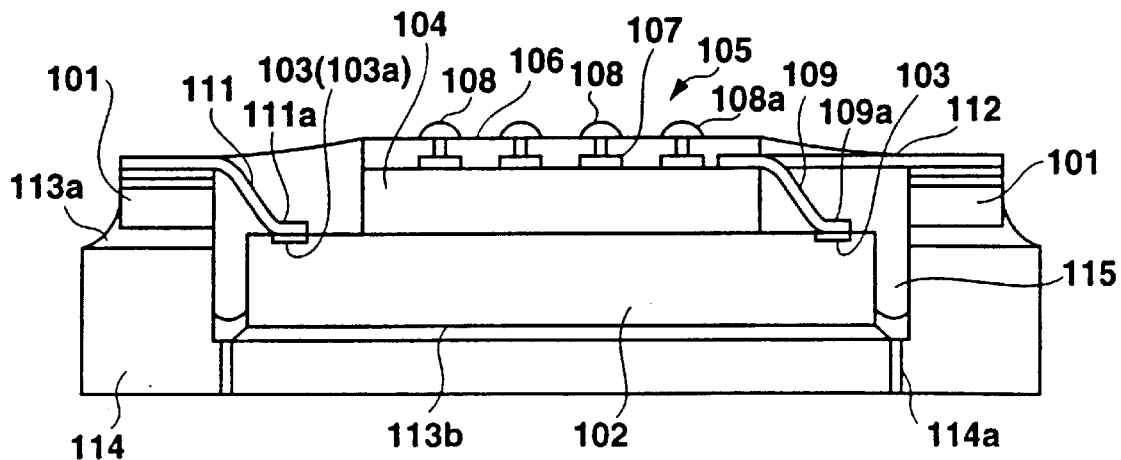
FIG. 13 is a side sectional view showing a semiconductor package according to a second embodiment of the invention.
Figure 14:
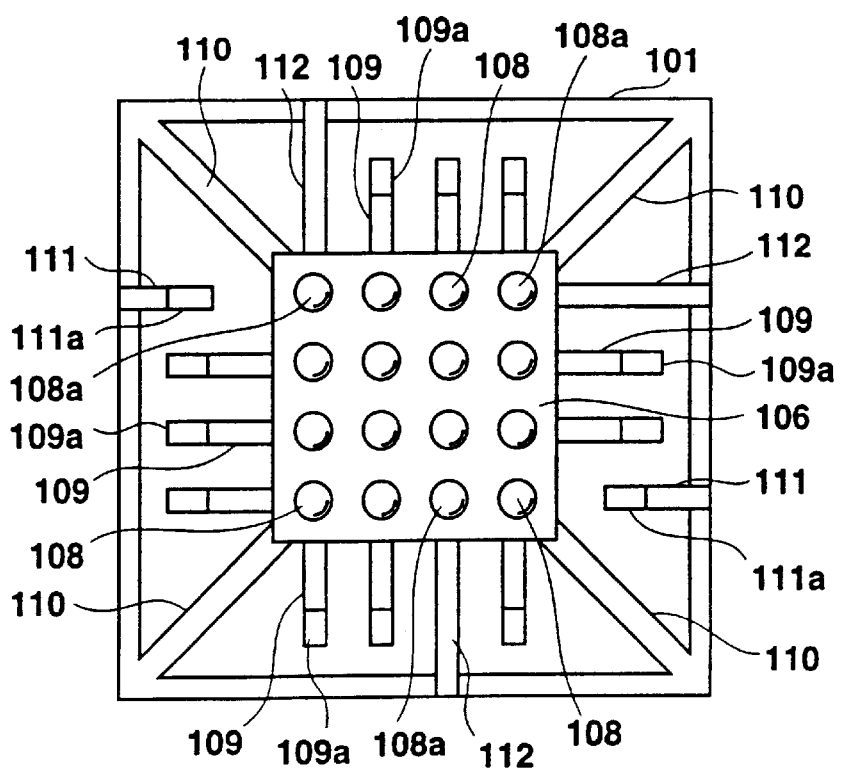
FIG. 14 is a plan view of the semiconductor package of FIG. 13.

FIG. 13 is a side sectional view of a semiconductor package according to a second embodiment of the invention, and FIG. 14 is its plan view.

As shown in FIGS. 13 and 14, a semiconductor chip 102 is disposed inside an outer ring 101 having a laminate structure. A plurality of electrode pads 103 are formed on the front surface (top surface in FIG. 13) along its periphery. A film circuit 105 is placed on and fixed to, via a bonding layer 104, a central portion of the chip front surface which excludes the pad forming region. The film circuit 105 consists of an insulating film 106 as a base and lead patterns 107 that are formed within the insulating film 106. Further, external connection terminals 108 are so formed as to project through small. holes that are formed in the film circuit 105 at positions corresponding to the ends of the respective lead patterns 107. The bonding layer 104 has proper elasticity, thereby serving as a buffer member for protecting the device forming region inside the pad forming region of the semiconductor chip 102 as well as bonding together the parts concerned.

The insulating film 106 as the base of the film circuit 105 is generally rectangular as viewed from above. A plurality of leads (hereinafter referred to as first leads) 109 extend from the four sidelines of the insulating film 106, and suspension leads 110 extend from its four corners. On the other hand, second leads 111 and third leads 112 extend from the outer ring 101 in parallel with the first leads 109. The first leads 109 come outward as extensions of the lead patterns 107 that are disposed within the insulating film 106 to electrically connect the electrode pads 103 that are formed on the semiconductor chip 102 to the external connection terminals 108 on the film circuit 105. Tips 109a of the first leads 109 are connected to the electrode pads 103 of the semiconductor chip 102. On the other hand, the second leads 111 extend from the inner periphery of the outer ring 101 toward the insulating film 106 to electrically connect grounding electrode pads 103a among the plurality of electrode pads 103 formed on the semiconductor chip 102 to the outer ring 101. Tips 111a of the second leads 111 are connected to the grounding electrode pads 103a. The third leads 112 bridge the insulating film 106 and the outer ring 101 to electrically connect grounding external connection terminals 108a among the plurality of external connection terminals 108 formed on the film circuit 105 to the outer ring 101.

In addition to the above components, a conductive stage 114 is bonded to the outer ring 101 and the back surface of the semiconductor chip 102 through conductive bonding layers 113a and 113b, respectively. The conductive bonding layers 113a and 113b are made of a conductive adhesive, a conductive paste, a conductive adhesive tape, or the like.

The conductive stage 114 is made of a conductive material such as copper or aluminum, and has, in the illustrated example, a generally concave sectional shape that conforms to a level difference between the outer ring 101 and the semiconductor chip 102. The conductive stage 114 is bonded to both of the outer ring 101 and the semiconductor chip 102 such that the top face of the peripheral portion of the conductive stage 114 is bonded to the outer ring 101 through the conductive bonding layer 113a and the bottom of the concave conductive stage 114 is bonded to the back surface of the semiconductor chip 102 through the conductive bonding layer 113b. In addition to electrically connecting the outer ring 101 to the back surface of the semiconductor chip 102, the conductive stage 114 increases the strength of, i.e., reinforces, the entire semiconductor package.

A space around the connecting portions between the electrode pads 103 (103a) of the semiconductor chip 102 and the first and second leads 109 and 111 (i.e., a space surrounded by the structure of the outer ring 101 and the conductive stage 114, and the other structure of the semiconductor chip 102, the bonding layer 104, and the film circuit 105) is charged with a sealing resin 115 such as an epoxy resin or a silicone resin. Further, a proper number of through-holes 114a are formed through the bottom of the concave conductive stage 114 at its peripheral positions. The through-holes 114a exhibits an effect of degassing during injection of the sealing resin 115 and mounting of the semiconductor package, thereby playing such roles as preventing a sealing defect due to insufficient charging and reducing thermal stress.

Next, a manufacturing method of the semiconductor package according to the second embodiment of the invention will be described.

First, as shown in FIG. 15A, a metal base 116 is prepared which is a laminate plate of a three-layer structure. More specifically, the metal base 116 is configured such that an aluminum film 118 of about 4.5 μm in thickness is formed on the front surface of a substrate 117 having a thickness of about 150 μm and made of copper or a copper alloy (hereinafter referred to as.a copper substrate) by evaporation, for instance, and a nickel film 119 of about 1–2 μm in thickness is formed thereon.

Of the above layers, the aluminum film 118 corresponds to an etching stopper film to prevent the front surface side of the metal base 116 from being etched when the copper substrate 117 will be etched in a later step. On the other hand, the nickel film 119 corresponds to a plating undercoat film, i.e., an undercoat film for copper plating for forming lead portions (described later) on the front surface of the metal base 116. Although the metal base 116 itself will not constitute any leads and will finally be removed excluding an outer ring portion, it is indispensable for formation of very fine leads.

As for the metal base 116, for instance, a chromium film of about 0.5 μm in thickness may be formed as a close contact film between the aluminum film 118 and the nickel film 119 to improve the adhesiveness of these films. As for the etching stopper film, a nickel film may be formed instead of the aluminum film 118. As for the plating undercoat film, a copper thin film may be formed instead of the nickel film 119.

Then, as shown in FIG. 15B, copper lead portions 120a, 120b, and 120c are patterned on the front surface of the metal base 116, i.e., on the front surface of the nickel film 119, by a selective plating method. Among those lead portions, the lead portions 120a, which correspond to the lead patterns 107 and the first leads 109, are formed in a large number so as to extend in the four directions toward the electrode pads 103 of the semiconductor chip 102. On the other hand, the lead portions 120b, which correspond to the second leads 111, are formed so as to extend from portions of the outer ring 101 corresponding to its outer periphery toward the center of a base sectioned region (described later). Further, the lead portions 120c, which correspond to the third leads 112, are formed so as to extend from portions of the outer ring 101 corresponding to its outer periphery to the inside of the lead portions 120a patterning region.

Although not shown in FIGS. 15A–15H, the suspension leads 110 are formed together with the lead portions 120a, 120b, and 120c by the selective plating method.

The selective plating is performed such that the front surface of the metal base 116 is selectively covered with a resist pattern or the like and electrolytic plating is performed by using the resist pattern as a mask. By selectively plating the metal base 116 with copper by the electrolytic plating, the lead portions 120a, 120b, and 120c are obtained which have superior film quality and are finely patterned.

Then, after slits 121 for defining the sectioned region of the metal base 116 are formed by etching as shown in FIG. 15C, the insulating film 106 of, for instance, about 40 μm in thickness is patterned excluding parts (to become the first leads 109) of the lead portions 120a as shown in FIG. 15D. At this time, parts of the lead portions 120c corresponding to the third leads 112 are covered with the insulating film 106. At this stage, the film circuit 105 is obtained which has the insulating film 106 as a base.

Then, as shown in FIG. 15E, the external connection terminals 108 such as solder balls are formed at the ends of the lead portions 120a and 120c that are covered with the insulating films 106 by using the insulating film 106 as a mask. The external connection terminals 108 are formed at the ends of the lead portions 120a projecting from the insulating film 106 such that an undercoat film of a metal material such as copper, nickel, or gold is formed by electrolytic plating, for instance, then a solder material of a tin-lead alloy is laid on the undercoat film by electrolytic plating, and finally the solder material is shaped into balls by causing it to reflow. At this time, the grounding external connection terminals 108a (see FIG. 14) are formed at the ends of the lead potions 120c.

Subsequently, as shown in FIG. 15F, the copper substrate 117 of the metal base 116 is removed by etching excluding its portion to become the outer ring 101. The aluminum film 118 serves as an etching stopper during this etching step, to remove only the copper substrate 117.

Then, as shown in FIG. 15G, the lead portions 120a, 120b, and 120c are rendered independent of each other by removing the aluminum film 118 of the metal base 116 by selective etching and further removing the nickel film 119 also by selective etching. Although in FIG. 15G the film circuit 105 is so drawn as to be separated from the outer ring 101, actually they are connected together via the suspension leads 110 (see FIG. 14).

Then, as shown in FIG. 15H, aluminum bumps 122a are formed at the tips of the lead portions 120a (corresponding to the first leads 109) extending from the insulating film 106 by sputtering or evaporation, for instance. At the same time, bumps 122b are formed at the tips of the lead portions 120b (corresponding to the second leads 111).

At this stage, a lead frame before mounting of a semiconductor chip is completed.

Next, a manufacturing procedure for mounting a semiconductor chip on the above-manufactured lead frame will be described with reference to FIGS. 16A–16E. In FIGS. 16A–16E, the lead portions 120c (third leads 112), which do not relate to the mounting of the semiconductor chip, are omitted.

Figure 16A:
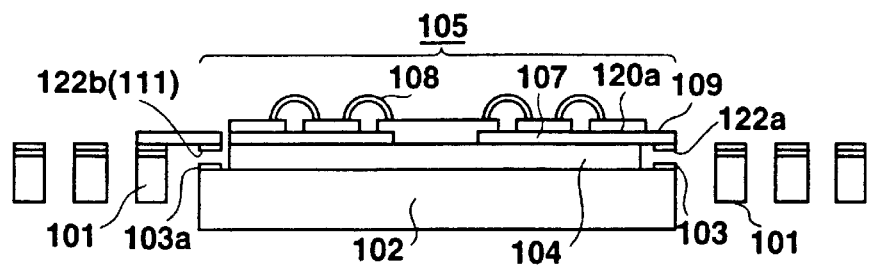
FIGS. 16A–16E show a manufacturing process of the semiconductor package of FIG. 13.

First, as shown in FIG. 16A, the semiconductor chip 102 is positioned and fixed to the lead pattern forming side of the film circuit 105 through the bonding layer 104. As a result, the bump 122a that are formed at the tips of the lead portions 120a (first leads 109) extending from the insulating film 106 are opposed to the electrode pads 103 on the semiconductor chip 102. Further, the bumps 122b that are formed on the tips of the lead portions 120b (second leads 111) extending from the outer ring 101 are opposed to the grounding electrode pads 103a on the semiconductor chip 102.

Figure 16B:
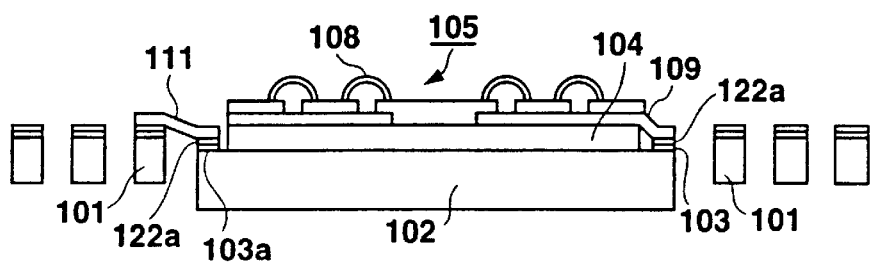

Then, as shown in FIG. 16B, the tips of the first leads 109 are connected to the electrode pads 103 of the semiconductor chip 102 through the bumps 122b by single point bonding, and the tips of the second leads 111 are connected to the grounding electrode pads 103a of the semiconductor chip 102 through the bumps 122b also by single point bonding.

Figure 16C:
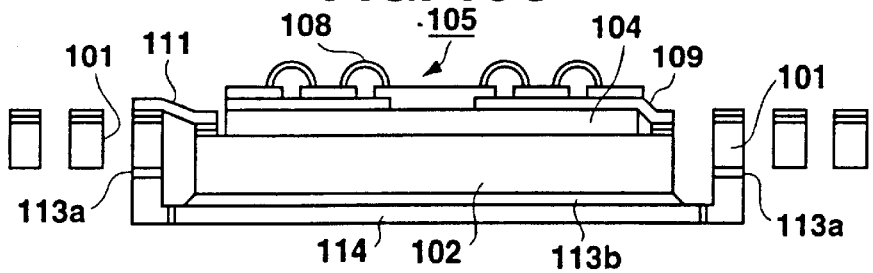
Figure 16D:
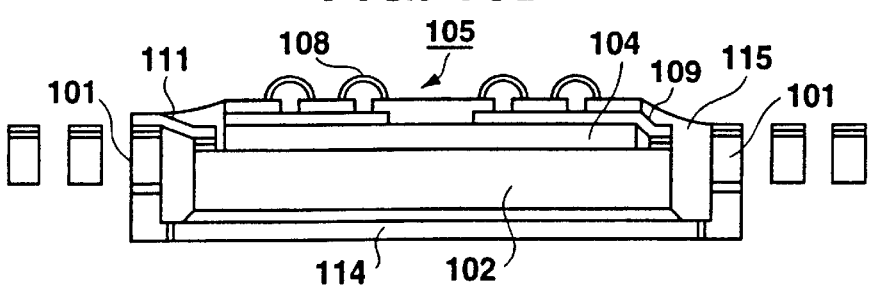

Thereafter, as shown in FIG. 16C, the conductive stage 114 is bonded to the outer ring 101 and the back surface of the semiconductor chip 102 through the conductive bonding layers 113a and 113b, respectively. Then, as shown in FIG. 16D, the sealing resin 115 such as an epoxy resin or a silicone resin is injected, by potting, into a space surrounded by the structure of the outer ring 101 and the conductive stage 114 and the other structure of the semiconductor chip 102, the bonding layer 104, and the film circuit 105. By curing the sealing resin 115, the constituent parts are integrated together.

Figure 16E:
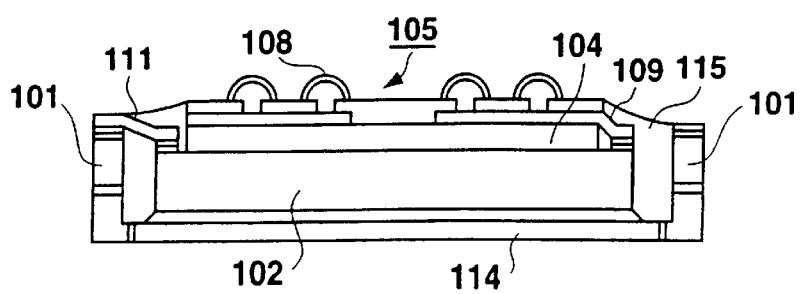

Finally, as shown in FIG. 16E, the semiconductor package shown in FIG. 13 is obtained by removing the unnecessary portions that are bounded by the outer periphery of the outer ring 101.

As described above, in the semiconductor package according to the second embodiment, the grounding electrode pads 103a are short-circuited with the chip back surface via the second leads 111, the outer ring 101, and the conductive stage 114. Further, the grounding external connection terminals 108a are also short-circuited with the chip back surface via the third leads 112, the outer ring 101, and the conductive stage 114. As a result, the chip back surface serves as the common ground, and the outer ring 101 and the conductive stage 114 that are connected to the chip back surface have the same potential. Therefore, a grounding line or a power line from a package mounting board can be connected to the electrode pads 103a of the semiconductor chip 102 in a more stable manner.

Depending on the structure of the semiconductor chip 102, the grounding may be taken from the chip back surface side to the chip front surface side (i.e., the circuit forming surface side), which increases the degree of freedom of circuit designing. Further, since heat generated in the semiconductor chip 102 can efficiently be dissipated from its back surface to the external environment via the conductive stage 114, the semiconductor package is superior in heat dissipation.

Although in the second embodiment the grounding electrode pads 103a and the grounding external connection terminals 108a are electrically connected to the outer ring 101 via the second leads 111 and the third leads 112, respectively, the invention is not limited to this structure. The same effects can be obtained even if power supply electrode pads and external connection terminals are electrically connected to the outer ring 101.

The second embodiment is directed to the fan-in-type semiconductor package in which the external connection terminals 108 exist inside the semiconductor chip 102. The invention can also be applied in a similar manner to a fan-out-type semiconductor package in which external connection terminals exist outside a semiconductor chip.

Figure 17:
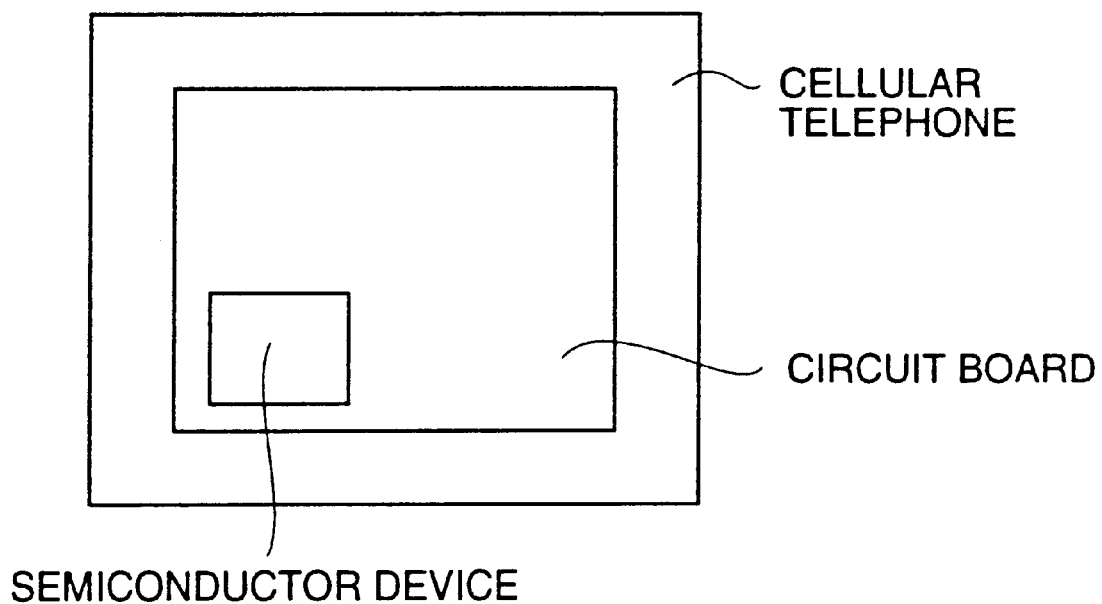
FIG. 17 schematically shows a cellular telephone in which a semiconductor device according to the invention is mounted on a circuit board.

Since the semiconductor device according to the invention realizes miniaturization of the package, it is very suitable for use in an electronic apparatus, such as a cellular telephone (see FIG. 17), in which the miniaturization is an important item to be attained. In such a case, the semiconductor device is mounted on a circuit board in the electronic apparatus such that the external connection terminals of the semiconductor package are connected to the circuit board.

As described above, according to the semiconductor package of the invention, since the thick-film protective layer is laminated on the effective device region of the semiconductor chip, the influence of radiations can be minimized by the shielding effect of the thick-film protective layer even without subjecting the chip front surface to any coating treatment. Further, since the interposition of the thick-film protective layer greatly reduces the space to be charged with the sealing resin, fast sealing can be enabled as well as the sealing resin can be saved. Further, since the front surface of the semiconductor chip is covered with the thick-film protective layer, stress-induced breakage can be prevented from occurring in the bonding portion on the chip front surface.

According to the semiconductor package of the invention, by electrically connecting the outer ring to at least one of the outer leads, say, a grounding outer lead, a microstrip structure is realized in which the insulating bonding layer (dielectric) is interposed between the plurality of leads (strip conductors) and the reinforcement plate (grounding plane), whereby crosstalk noise can be reduced greatly.

In the lead frame manufacturing method of the invention, since the bumps are formed before the reinforcement plate is bonded to the lead surfaces, the bumps are never polluted by a gas generated from the bonding layer for bonding of the reinforcement plate. Therefore, high-quality bumps can be formed on the tips of the inner leads.

In the lead frame manufacturing method of the invention, since the solder members are shaped into balls by reflowing immediately after the solder members are laid on the leads at the given positions by electrolytic plating, there occurs almost no oxidation of the solder members over time. Therefore, it is not necessary to perform brushing prior to the reflowing. Thus, problems that would otherwise be caused by the brushing can be solved at a stroke.

According to the second aspect of the invention, the grounding or power supply electrode pads are electrically connected to the outer ring via the second leads, the grounding or power supply external connection terminals are electrically connected to the outer ring via the third leads, and the conductive stage is bonded to the back surface of the semiconductor chip and the outer ring through the respective conductive bonding layers. Therefore, a grounding line or a power line from a package mounting board can be connected to the electrode pads of the semiconductor chip in a more stable manner. As a result, a variation in the grounding or power supply potential in the package can be reduced. Thus, the invention can provide a semiconductor package of an ultra-many-pin structure which is superior in electrical characteristics.

What is claimed is:

1. A manufacturing method of a lead frame, comprising the steps of:

forming a plurality of leads on a surface of a metal base of a laminated structure by metal plating with at least one of the plurality of leads formed as to extend to an outer ring portion of the metal base;

separating the plurality of leads from each other by selectively removing the metal base by etching; and forming bumps on tips of the respective separated leads, and then bonding a reinforcement plate to lead surfaces excluding bump forming regions thereof;

filling the outer ring portion with a conductor paste that is in contact with the at least one of the plurality of leads and the reinforcement plate.

2. A manufacturing method of a lead frame, comprising the steps of:

forming a plurality of leads on a surface of a metal base of a laminated structure by metal plating with at least one of the plurality of leads formed as to extend to an outer ring portion of the metal base;

covering given regions of the leads with an insulating film; and layering a solder material on the leads at given positions by electrolytic plating with the insulating film used as a mask, and, immediately thereafter, shaping the solder material into ball shapes by reflowing;

filling the outer ring portion with a conductor paste that is in contact with the at least one of the plurality of leads and the reinforcement plate.

3. A manufacturing method of a semiconductor device, comprising the steps of:

forming a plurality of leads on a surface of a metal base of a laminated structure by metal plating with at least one of the plurality of leads formed as to extend to an outer ring portion of the metal base;

covering given regions of the leads with an insulating film;

separating the plurality of leads from each other by selectively removing the metal base by etching;

forming bumps on tips of the respective separated leads, and then bonding a reinforcement plate to lead surfaces excluding bump forming regions thereof; and connecting electrodes of a semiconductor chip to the bumps;

filling the outer ring portion with a conductor paste that is in contact with the at least one of the plurality of leads and the reinforcement plate.

4. The manufacturing method according to claim 3, further comprising the step of laying a solder material on the leads at given positions by electrolytic plating with the insulating film used as a mask, and, immediately thereafter, shaping the solder material into ball shapes by reflowing.

* * * * *